United States Patent
Ono

(10) Patent No.: US 6,524,889 B2
(45) Date of Patent: Feb. 25, 2003

(54) METHOD OF TRANSCRIBING A WIRING PATTERN FROM AN ORIGINAL SUBSTRATE TO A SUBSTRATE WITH CLOSELY MATCHED THERMAL EXPANSION COEFFICIENTS BETWEEN BOTH SUBSTRATES FOR DIMENSIONAL CONTROL OF THE TRANSCRIBED PATTERN

(75) Inventor: Yoshihiro Ono, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/932,875

(22) Filed: Aug. 21, 2001

(65) Prior Publication Data

US 2002/0025668 A1 Feb. 28, 2002

(30) Foreign Application Priority Data

Aug. 23, 2000 (JP) ......................................... 2000-251985

(51) Int. Cl.[7] .............................. H01L 21/78; H05K 3/20
(52) U.S. Cl. ...................... 438/113; 438/460; 438/622; 156/230; 156/241
(58) Field of Search ................................ 438/113, 460, 438/616, 622; 156/234, 235, 241, 230; 427/146; 428/344, 352

(56) References Cited

U.S. PATENT DOCUMENTS

| | | | | |
|---|---|---|---|---|
| 5,151,388 A | * | 9/1992 | Bakhit et al. | 437/209 |
| 5,192,716 A | * | 3/1993 | Jacobs | 437/209 |
| 5,258,236 A | * | 11/1993 | Arjavalingam et al. | 428/626 |
| 5,691,245 A | * | 11/1997 | Bakhit et al. | 437/209 |
| 6,036,809 A | * | 3/2000 | Kelly et al. | 156/247 |
| 6,294,407 B1 | * | 9/2001 | Jacobs | 438/118 |

FOREIGN PATENT DOCUMENTS

| | | | | |
|---|---|---|---|---|
| JP | 3-270292 A | * | 12/1991 | ............ H05K/3/46 |
| JP | 8-186375 | | 7/1996 | |

OTHER PUBLICATIONS

"Low Expansion Block for Chip Carrier," IBM Technical Disclosure Bulletin v. 21 No. 3 p. 951, Aug. 1978.*

"Process for Direct Printing of High–Resolution Metal Patterns," IBM Technical Disclosure Bulletin v. 32 No. 3A pp. 465–467, Aug. 1989.*

C. Narayan et al., "Thin Film Transfer Process for Low Cost MCM–D Fabrication," IEEE Transactions on Components, Packaging, and Manufacturing Technology—Part B, vol. 18, No. 1, pp. 42–46, Feb. 1995.*

* cited by examiner

*Primary Examiner*—Olik Chaudhuri
*Assistant Examiner*—Stephen W. Smoot
(74) *Attorney, Agent, or Firm*—Young & Thompson

(57) ABSTRACT

A wiring pattern formation method for forming a wiring pattern on a wafer by using a transcribing operation includes a transcribing step of thermally pressing and adhering a transcribing original substrate 19 that contains a metallic wiring layer 15 to be transcribed and has a linear expansion coefficient in which a dimensional error from a wafer 10 is within a predetermined range in a heated condition, on the wafer 10, and then adhering and transcribing the metallic wiring layer 15.

8 Claims, 7 Drawing Sheets

REPEATED IN A PLURALITY OF ORIGINAL SUBSTRATES 19, AS NECESSARY

THERMALLY PRESSING AND ADHERING OPERATION (REMOVE BASE SUBSTRATE)

⇩ THERMALLY PRESSING AND ADHERING OPERATION

↓ (REMOVE BASE SUBSTRATE)

31 INSULATION LAYER

METHOD OF TRANSCRIBING A WIRING PATTERN FROM AN ORIGINAL SUBSTRATE TO A SUBSTRATE WITH CLOSELY MATCHED THERMAL EXPANSION COEFFICIENTS BETWEEN BOTH SUBSTRATES FOR DIMENSIONAL CONTROL OF THE TRANSCRIBED PATTERN

BACKGROUND OF THE INVENTION

1. Field of the Invention

The present invention relates to a wiring pattern formation method, and an original substrate used for the method. More particularly, the present invention relates to a wiring pattern formation method manufactured at a wafer level, and an original substrate used for the method.

2. Description of the Related Art

Conventionally, a multiple-layer print wiring substrate having a plurality of wiring pattern layers sequentially transcribed onto a substrate and a method for manufacturing the same have been well known (refer to Japanese Laid Open Patent Application (JP-A-Heisei, 8-186375).

FIGS. 7A, 7B illustrate a wiring pattern formed on the conventional multiple-layer print wiring substrate. FIG. 7A is a sectional view showing the multiple-layer print wiring substrate, and FIG. 7B is a sectional view showing an original substrate for transcribing the wiring pattern. As shown in FIGS. 7A, 7B, a multiple-layer print wiring substrate 1 has a plurality of wiring pattern layers 3 laminated on a substrate 2 (refer to FIG. 7A).

This multiple-layer print wiring substrate 1 is manufactured by using a transcribing original substrate 4. In the transcribing original substrate 4, a wiring pattern layer 8 composed of a conductive layer 6 and an insulation resin layer 7 having an agglomerating property and an adhesive property is placed on a conductive substrate 5 in which at least surface has a conductive property (refer to FIG. 7B).

When the multiple-layer print wiring substrate 1 is manufactured, a plurality of transcribing original substrates 4 is firstly produced. Then, this transcribing original substrate 4 is thermally pressed and adhere on one surface of the substrate 2 constituting the multiple-layer wiring pattern. Next, the conductive substrate 5 is removed from the substrate 2, and the wiring pattern layer 8 is transcribed. After that, this transcribing operation is sequentially repeated, a plurality of wiring pattern layers 3 are laminated on the substrate 2, and the multiple-layer print wiring substrate is manufactured.

However, a problem is induced when the wiring formation using the above conventional transcription is carried out in a wide area such as a wafer level. That is, when it is performed on the surface at the wafer state (the wafer level) without being done after the wafer is diced into individual chips, the sufficiently dimensional accuracy can not be obtained. Thus, it is impossible to apply the wiring formation using the conventional transcription. By the way, a method may be considered for again forming the wiring on the wafer by using a subtractive method or an additive method. However, in this case, it is impossible to avoid the manufacturing cost from being increased.

In short, in the case of the wiring formation using the conventional transcription, a metallic plate or an insulation substrate in which a conductive thin film is formed on a surface is used as the transcribing original substrate 4. A difference of a linear expansion coefficient is not considered between the transcribing original substrate 4 and the substrate 2. Moreover, the transcription to the substrate 2 of the wiring pattern is done by the thermally pressing adhesive operation under the condition at a temperature from 180 to 200° C. and a pressure from 40 to 50 kgf/cm$^2$.

For this reason, if the wiring formation using the conventional transcription is diverted to the wiring formation at the wafer level, a large dimensional error is induced in the transcribed wiring pattern, since the transcription target has the wide area at the wafer level, in addition to the difference of the linear expansion coefficient between the transcribing original substrate and the wafer.

For example, if an original substrate made of stainless steel is used to transcribe a wiring pattern at a temperature of 200° C. onto a wafer having a diameter of about 300 mm, the difference of the linear expansion coefficient causes a dimensional error of about 300 $\mu$m to be induced at both ends of the wafer. Here, the linear expansion coefficient of the original substrate made of stainless steel is 16 ppm/degree, and the linear expansion coefficient of the wafer is 4 ppm/degree.

In order to cope with such a dimensional error, a dimensional correction may be often done for considering the difference of the linear expansion coefficient. However, in this case, the value of the dimensional correction must be changed if the temperature in the pressing and adhering operation at the time of the transcription is different.

Also, when the wiring layer is formed on the wafer, the subtractive method and the additive method are mainly used. Here, the subtractive method sticks a metallic foil on a wafer and then forms a pattern by using an etching operation. The additive method forms a wiring pattern by using a metallic plating operation.

With regard to both the methods, the subtractive method is high in technical perfectivity and low in cost. However, it is not suitable for the formation of micro pattern. On the contrary, the additive method is suitable for the formation of micro pattern. However, it is high in cost and lack of reliability.

Moreover, if the multiple-layer wiring is formed, the procedure is repeated in turn for forming the insulation layer after the wiring pattern layer is formed by using the above-mentioned method. However, the occurrence of a trouble in an interlayer causes a manufacturing cost to be increased since the repairing of a product is difficult.

It is therefore an object of the present invention to provide a wiring pattern formation method, which can obtain a sufficiently dimensional accuracy even if the wiring formation using the transcription is carried out in the wide area such as the wafer level and can also avoid a manufacturing cost to be increased, and an original substrate used for the method.

SUMMARY OF THE INVENTION

In order to attain the above-mentioned object, a wiring pattern formation method according to the present invention is characterized in that a wiring pattern formation method, which forms a wiring pattern on a substrate through a transcribing operation, includes a transcribing step of thermally pressing and adhering on the substrate the transcribing original substrate that contains a wiring layer to be transcribed and has a linear expansion coefficient in which a dimensional error from the substrate is within a predetermined range in a heated condition, and then adhering and transcribing the wiring layer.

Due to the above-mentioned configuration, the transcribing original substrate that contains the wiring layer to be transcribed and has the linear expansion coefficient in which the dimensional error from the substrate is within the predetermined range in the heated condition is thermally pressed and adhered on the substrate, and the wiring layer is adhered and transcribed, and the wiring pattern is formed on the substrate through the transcribing operation. Thus, even if the wiring formation using the transcription is carried out in the wide area such as the wafer level, it is possible to obtain the sufficiently dimensional accuracy and further possible to avoid the manufacturing cost to be increased.

Also, the original substrate used for the wiring pattern formation method according to the present invention enables the wiring pattern formation method to be attained.

DESCRIPTION OF THE PREFERRED EMBODIMENTS

Embodiments of the present invention will be explained below with reference to the drawings.

Figure 1A:
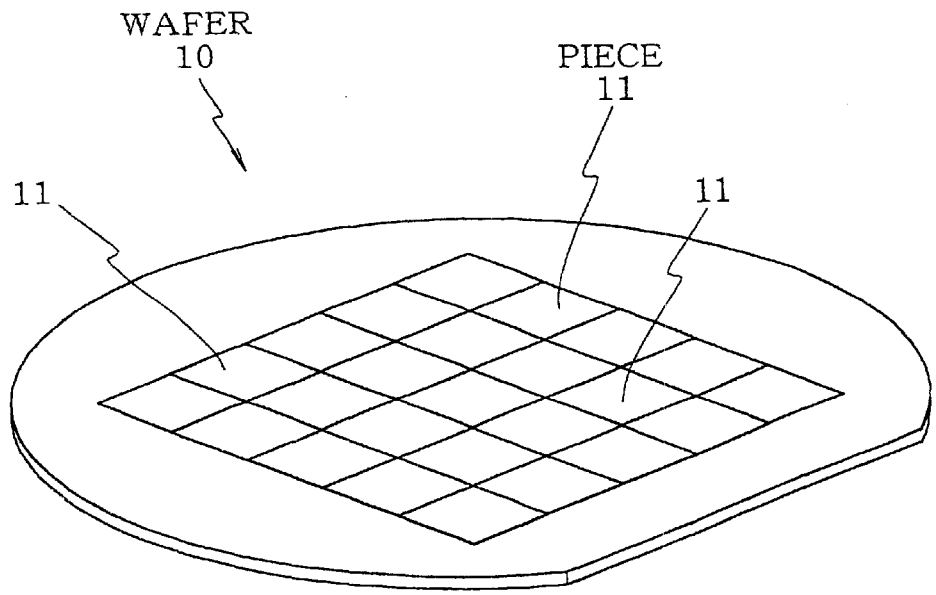
FIGS. 1A, 1B showing a wafer in which a multiple-layer wiring pattern is formed by using a wiring pattern formation method according to an embodiment of the present invention.
Figure 1B:
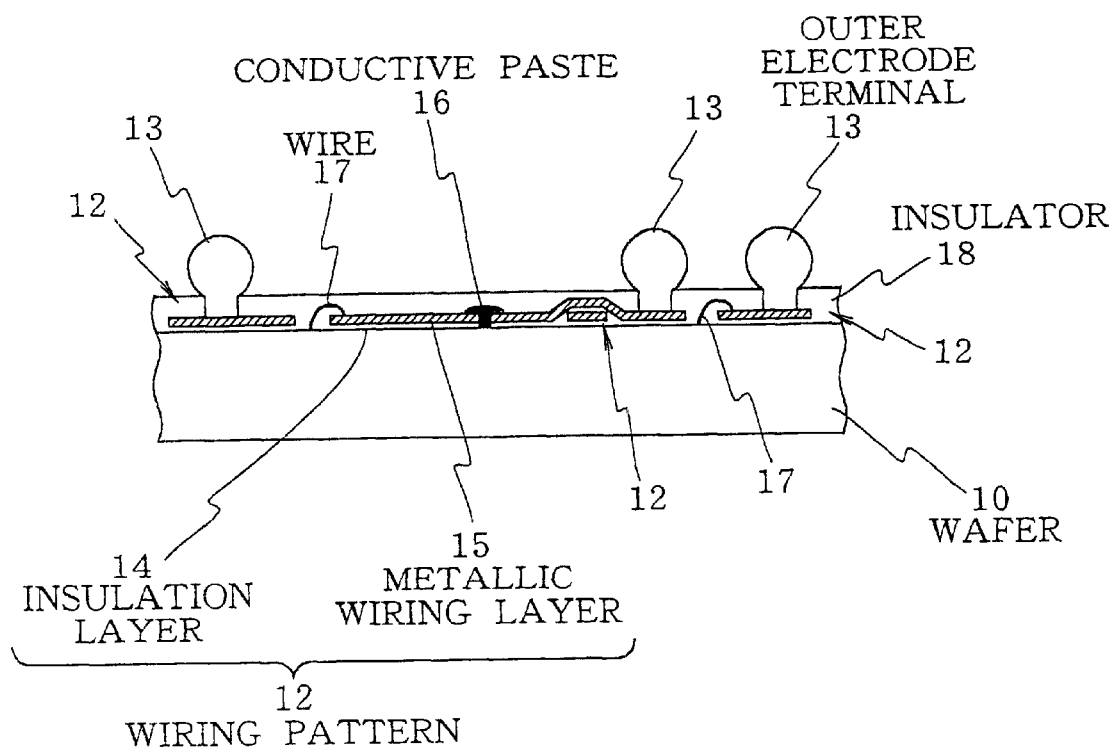

FIG. 1A and FIG. 1B showing a wafer in which a multiple-layer wiring pattern is formed by using a wiring pattern formation method according to an embodiment of the present invention. A wafer 10 shown in FIG. 1 is, for example, a silicon wafer at a state before it is diced. So, a process for forming an element is carried out, and a circuit is already formed. This wafer 10 is diced and cut into respective pieces 11 (refer to FIG. 1A). Then, a semiconductor device (not shown) is formed through a predetermined process.

A wiring pattern 12 having a multiple-layer structure and an outer electrode terminal 13 composed of a metallic bump connected to the wiring pattern 12 and the like are formed on the surface of the wafer 10 (refer to FIG. 1B).

The wiring pattern 12 has an insulation layer 14 composed of adhesive and a metallic wiring layer 15 laminated on the insulation layer 14. For example, the adjacent wiring patterns 12 are connected each other through a conductive paste 16, and also the wiring pattern 12 is connected to a wafer 10 through a wire 17, respectively. Also, an insulator 18 is coated on the surface of the wiring pattern 12, at a condition that the outer electrode terminal 13 is exposed.

This wiring pattern 12 is formed by performing the transcription using a transcribing original substrate on the wafer 10, at a stage before the wafer 10 is cut into the respective pieces 11, namely, at a wafer level implying a stage after a formation of element, a formation of wiring by diffusion and a formation of bonding pad and the like.

Figure 2:
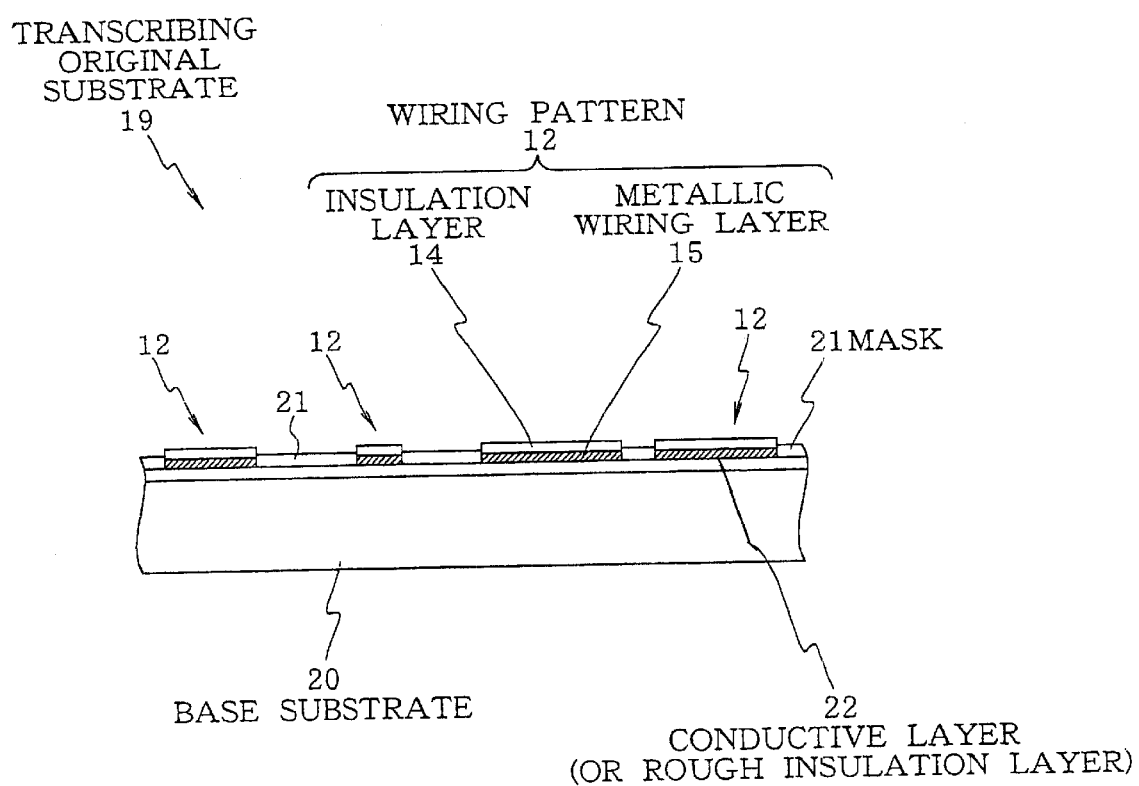
FIG. 2 is a sectional view showing a transcribing original substrate used when the wiring pattern of FIG. 1 is formed.

FIG. 2 is a sectional view showing a transcribing original substrate used when the wiring pattern of FIG. 1 is formed. As shown in FIG. 2, a transcribing original substrate 19 has a base substrate 20 and a wiring pattern 12 formed on a surface of the base substrate 20. The surface of the base substrate 20 on which the metallic wiring layer 15 is not formed is covered with a mask 21.

This transcribing original substrate 19 has the shape substantially equal to that of the wafer 10 (in a plan view). For example, if the wafer 10 has a diameter of 300 mm, the corresponding transcribing original substrate 19 also has a diameter of 300 mm, and has the plan shape similar to that of the wafer 10.

The base substrate 20 is made of material so that a dimensional displacement of a wiring layer caused by a difference of a linear expansion coefficient is never induced between the base substrate 20 and the wafer 10 targeted for the transcription, and at least a surface layer is made of conductive material such as metal and the like so that the surface has a conductive layer 22. Also, it may be a roughed insulation layer made of, for example, polyimide, liquid crystal polymer and the like, instead of the conductive layer 22.

As this base substrate 20, a stainless steel (having a linear expansion coefficient of 16 ppm/degree) and the like can be used as an example, a linear expansion coefficient of the stainless steel is within a range of about ±10 ppm/deg as compared with a linear expansion coefficient of the wafer 10. Also, it is desirable to use Mo and the like. A linear expansion coefficient of Mo (5. 1), glass ceramics (5. 8), graphite (2 to 6) and the like is within a range of about ±2 ppm/deg as compared with that of the wafer 10. Moreover, the usage of the material whose linear expansion coefficient is substantially equal to that of the wafer 10, as an example, Si (4. 0), SiC (3. 7), Si—SiC (4. 5), Al—N (4. 5), InP (4. 5) and the like, is optimal. Here, the numeral within the parentheses represents the linear expansion coefficient. By the way, it is designed that the thickness does not exceed a range from about 0.05 mm to several tens of millimeters.

As the conductive layer 22, for example, Al, Cu, Ni, Cr, Fe (SUS) and the like are used, and it is formed at a thickness of about 1 $\mu$m.

The wiring pattern 12 has the metallic wiring layer 15 formed by, for example, an electroplating operation, and the insulation layer 14 composed of wire adhesive laminated on the metallic wiring layer 15. As the metallic wiring layer 15, for example, Au, Al, Cu, Cu+Sn and the like are used, and it is formed at thicknesses from about 10 $\mu$m to about 20 $\mu$m. As the insulation layer 14, an insulation material on which an electrolytic plating operation can be performed, for example, polyimide and the like are used, and it is formed at thicknesses from about 10 $\mu$m to about 20 $\mu$m.

A plurality of kinds of transcribing original substrates 19 having different kinds of wiring patterns 12 are formed correspondingly to the multiple-layered wiring layer.

FIGS. 3A to 3E are sectional views describing the wiring pattern formation method, at the wafer level using the transcribing original substrate of FIG. 2. As shown in FIGS. 3A to 3E, at first, the transcribing original substrate 19 in which the wiring pattern 12 is oriented to the surface of the wafer 10 is thermally pressed and adhered on the surface of the wafer 10 after the completion of the circuit formation, at the wafer level (refer to FIG. 3A).

The thermally pressing and adhering operation of the transcribing original substrate 19 causes the wiring pattern 12 to be adhered via the insulation layer 14 on the surface of the wafer 10. Thus, the metallic wiring layer 15, the mask 21, the conductive layer 22 and the base substrate 20 are laminated via the insulation layer 14 on the wafer 10, in the order of description. As the press and adhesion condition, for example, a temperature is in a range from about 100° C. to about 200° C., and a pressure is several tens of kgf/cm².

Next, the base substrate 20 is removed from the wafer 10 to which the wiring pattern 12 is transcribed. At this time, the mask 21 and the conductive layer 22 are also removed together with the base substrate 20. Only the metallic wiring layer 15 adhered via the insulation layer 14 is left on the surface of the wafer 10. Thus, one layer of the wiring pattern 12 is formed on the wafer 10 (refer to FIG. 3B).

After that, the pressing and adhering operation of the transcribing original substrate 19 and the removal of the base substrate 20 are sequentially repeated for the plurality of transcribing original substrates 19, as necessary. The multiple-layer wiring layer composed of a plurality of layers of wiring patterns 12 is formed on the wafer 10.

Figure 3A:
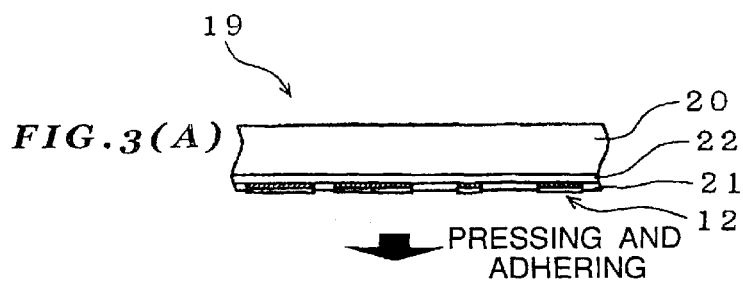
FIGS. 3A to 3E are sectional views describing the wiring pattern formation method at a wafer level using the transcribing original substrate of FIG. 2.
Figure 3B:
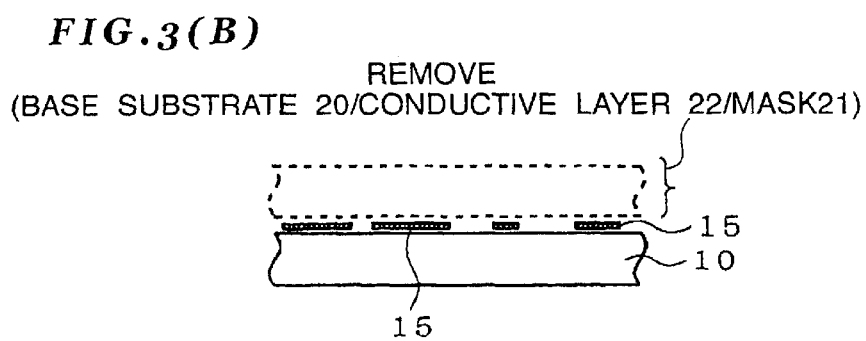
Figure 3C:
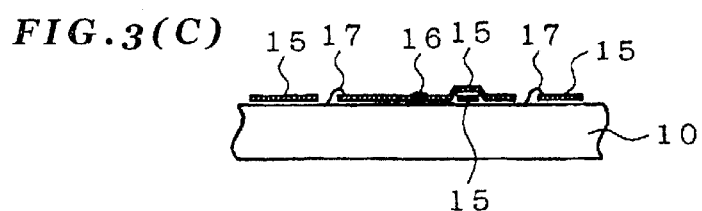
Figure 3D:
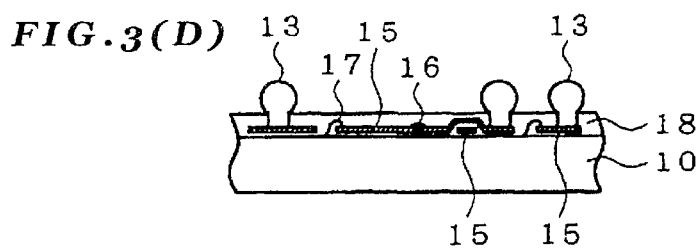
Figure 3E:
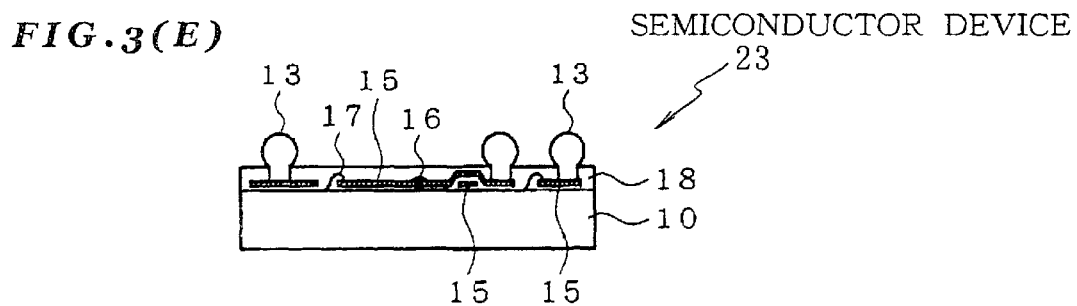

Next, as for the formed multiple-layer wiring layer, the connection through a connection component is carried out between the respective metallic wiring layers 15 through the conductive paste 16, or between the wafer 10 and the metallic wiring layer 15 through the wire 17 (refer to FIG. 3C).

After the completion of the connection, the part except the necessary portion for the external electrode on the surface of the wafer 10 in which the multiple-layer wiring layer is formed is covered with the insulator 18. A metallic ball, a metallic bump and the like are mounted as the outer electrode terminals 13, on the left portion which is not covered with the insulator 18 (refer to FIG. 3D).

Finally, the dicing operation causes the wafer 10, in which the multiple-layer wiring layer is formed, to be cut into the respective pieces 11 (refer to FIG. 1A). Then, a semiconductor device 23 is formed which has a multiple-layer wiring structure with each of the cut wafers 10 as the substrate (refer to FIG. 3E) As mentioned above, the thermally pressing and adhering operation using the transcribing original substrate 19 causes the wiring pattern 12 to be transcribed to the wafer 10. However, another example of the transcribing method for using the transcribing original substrate will be described below.

Figure 4A:
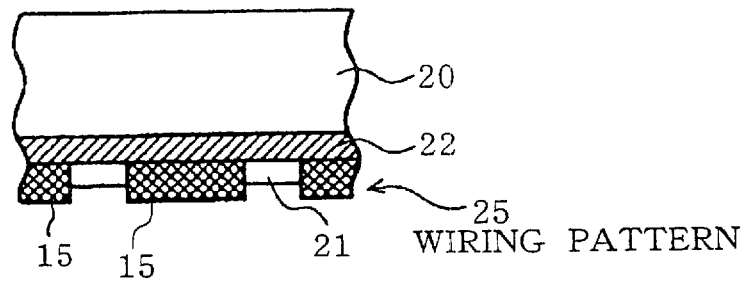
FIGS. 4A to 4C are sectional views describing another example of a method for transcribing a wiring pattern of FIGS. 3A to 3E.
Figure 4B:
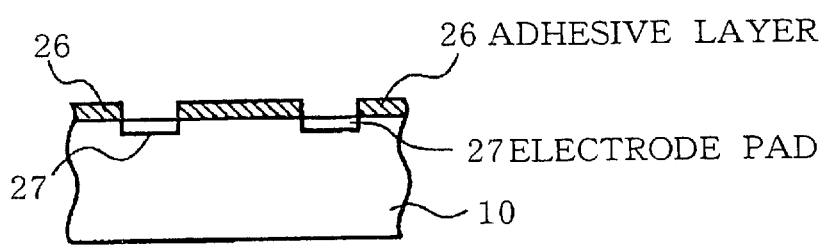
Figure 4C:
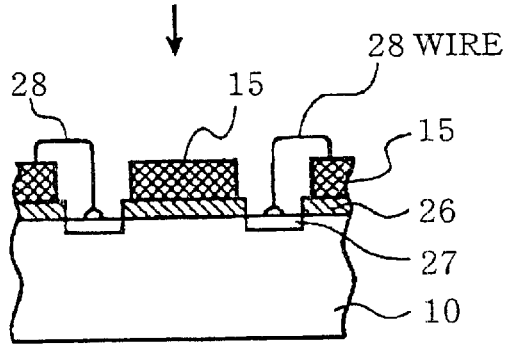

FIGS. 4A to 4C are sectional views describing another example of the method for transcribing a wiring pattern of FIGS. 3A to 3E. In the method for transcribing a wiring pattern in this example, the insulation layer 14 serving as the adhesive layer positioned on the side of the transcribing original substrate 19 in the above-mentioned example is positioned on the side of the wafer 10, and the wiring pattern 12 is transcribed to the wafer 10, and then the electrical connection is carried out by using a wire bonding. The other configurations and actions are similar to those of the above-mentioned example (refer to FIGS. 3A to 3E).

As shown in FIGS. 4A to 4C, a transcribing original substrate 24 has the base substrate 20 and the wiring pattern 25, which does not have the insulation layer 14 serving as the adhesive layer, through the surface of the base substrate 20, namely, a wiring pattern 25 composed of the metallic wiring layer 15. The conductive layer 22 may be the roughed insulation layer made of polyimide, liquid crystal polymer and the like. A part of the surface of the base substrate 20 on which the metallic wiring layer 15 is not formed is covered with the mask 21 (refer to FIG. 4A).

An adhesive layer 26 is laminated on the surface of the wafer 10, correspondingly to the metallic wiring layer 15 of the transcribing original substrate 24 to be thermally pressed and adhered on the wafer 10. Electrode pads 27 are mounted at the necessary portions corresponding to the mask 21 (refer to FIG. 4B).

The adhesive layer 26 placed on the wafer 10 is the insulation layer having the adhesive property also serving as the circuit protection film of the wafer 10, in which insulation material made of epoxy, polyimide and the like is formed at thicknesses from about 10 μm to about 20 μm, for example, by using a coating or laminating process. By the way, it is allowable to use not only the adhesive property of the insulation material after curing, but also the adhesive property prior to the curing of the insulation material.

The wiring pattern 25 composed of the metallic wiring layer 15 is transcribed onto the surface of the wafer 10 by thermally pressing and adhering this transcribing original substrate 24 on the wafer 10 on which the adhesive layer 26 is laminated. As the press and adhesion condition, for example, a temperature is in a range from about 100° C. to about 200° C., and a pressure is several ten kgf/cm².

After that, the removal of the base substrate 20 causes the mask 21 and the conductive layer 22 to be removed together with the base substrate 20. Only the metallic wiring layer 15 adhered via the adhesive layer 26 is left on the surface of the wafer 10 (refer to FIG. 3C). If the multiple-layer wiring layer is formed, the transcribing original substrate 19 having the insulation layer 14 and the metallic wiring layer 15 is used (refer to FIG 2) to sequentially repeat the transcription of the wiring pattern and the removal of the base substrate, as necessary.

After the transcription of the wiring pattern 25 onto the wafer 10, the electrical connection between the metallic wiring layer 15 and the electrode pad 27 is carried out by the wire bonding operation using the wire 28. For example, Cu or Au of about φ20 μm to about φ50 μm or the like is used as the wire 28.

Figure 5A:
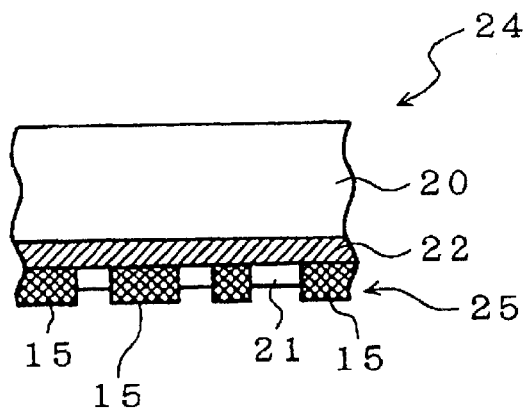
FIGS. 5A to 5C are sectional views describing still another example of a method for transcribing a wiring pattern of FIGS. 3A to 3E.
Figure 5B:
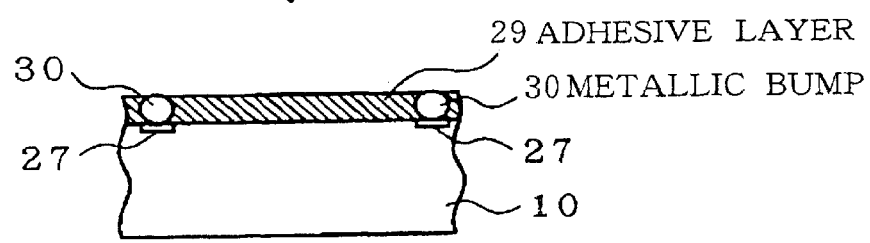

FIGS. 5A to 5B are sectional views describing still another example of the method for transcribing a wiring pattern of FIGS. 3A to 3E. The method for transcribing a wiring pattern in this embodiment collectively carries out the transcription of the metallic wiring layer 15 onto the wafer 10 and the electrical connection between the metallic wiring layer 15 and the electrode pad 27. The other configurations and actions are similar to those of the above-mentioned case (refer to FIGS. 4A to 4C).

Figure 5C:
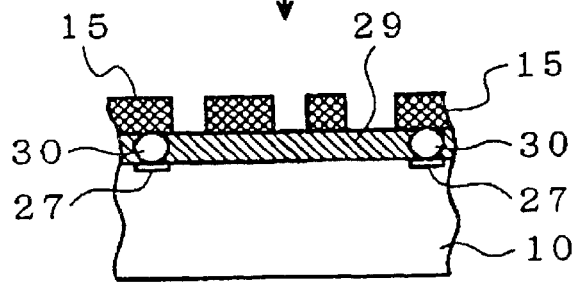

As shown in FIGS. 5A to 5C, an adhesive layer 29 is laminated on the entire region of the surface of the wafer 10, on the wafer 10 on which the transcribing original substrate 24 (refer to FIG. 5A) is thermally pressed and adhered. A metallic bump 30 is placed on the electrode pad 27 placed at a predetermined portion (refer to FIG. 5B).

This adhesive layer 29 is the insulation layer having the adhesive property also serving as the circuit protection film of the wafer 10, in which insulation material made of epoxy, polyimide and the like is formed at thicknesses from about 10 μm to about 20 μm. By the way, it is allowable to use the adhesive property of the insulation material prior to the curing.

For example, Au or solder is used as the metallic bump 30. When the metallic bump 30 is made of Au as the wiring metal, for example, a dual layer structure of Sn/Cu is used (Sn is located on the Au connection side). If the metallic bump 30 is made of solder, for example, Au or Cu is used.

The wiring pattern 25 composed of the metallic wiring layer 15 is transcribed onto the surface of the wafer 10 by thermally pressing and adhering this transcribing original substrate 24 on the wafer 10 on which the adhesive layer 29 is laminated. As the press and adhesion condition, for example, in the case of the Au-Sn connection, the temperature is close to about 227° C. In the case of the solder connection, the temperature is close to about 240° C. by using flux which does not require a cleaning (in a case of eutectic), and it is close to about 260° C. (in a case of Pb free) and within a range from about 300 to 350° C. (in a case of a high melting point). And, the pressure is several ten kgf/cm$^2$.

After that, the removal of the base substrate 20 causes the mask 21 and the conductive layer 22 to be removed together with the base substrate 20. Only the metallic wiring layer 15 adhered via the adhesive layer 29 is left on the surface of the wafer 10. At the same time, the electrical connection between the metallic wiring layer 15 and the electrode pad 27 is carried out through the metallic bump 30 (refer to FIG. 5C). If the multiple-layer wiring layer is formed, the transcribing original substrate 19 having the insulation layer 14 and the metallic wiring layer 15 is used (refer to FIG. 2) to sequentially repeat the transcription and the base substrate removal, as necessary.

In the above-mentioned wiring pattern formation method, after the wiring pattern is transcribed by using the transcribing original substrate, the base substrate and the like are removed in order to leave the metallic wiring layer 15 on the surface of the wafer 10. The method for removing the base substrate and the like will be described below.

Figure 6A:
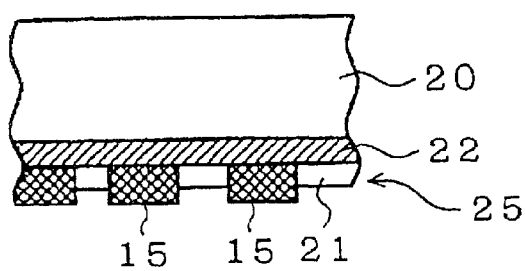
FIGS. 6A to 6D are explanation views showing structures of various original substrates used in the wiring pattern formation method according to the present invention.
Figure 6B:
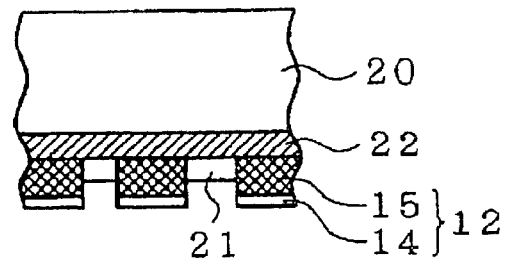
Figure 6C:
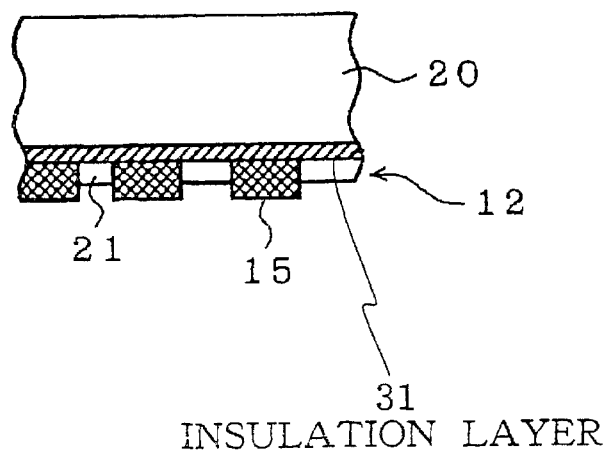
Figure 6D:
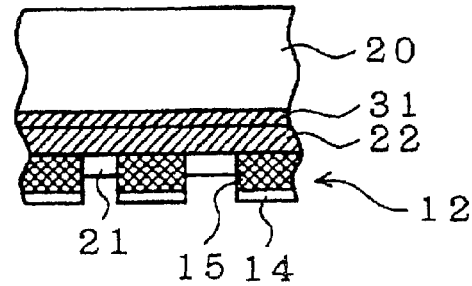
Figure 7A:
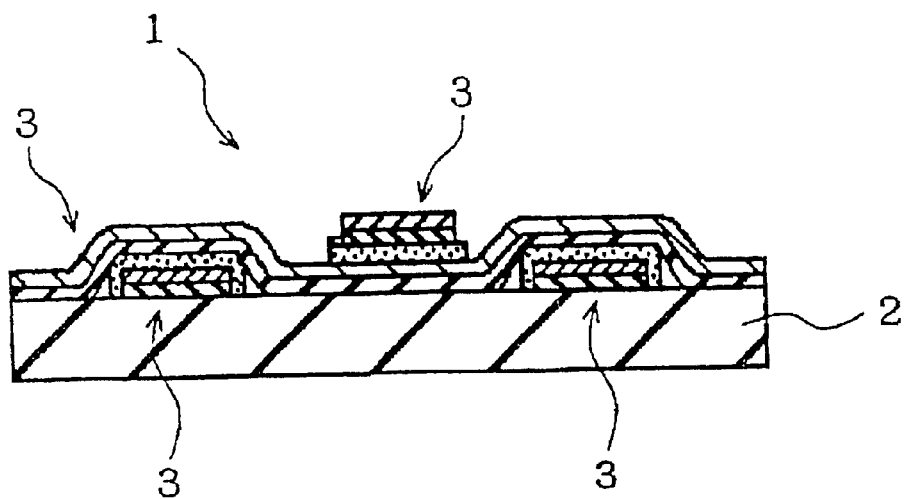
FIG. 7A is a sectional view showing a multiple-layer print wiring substrate, in explaining a wiring pattern formed on a conventional multiple-layer print wiring substrate.
Figure 7B:
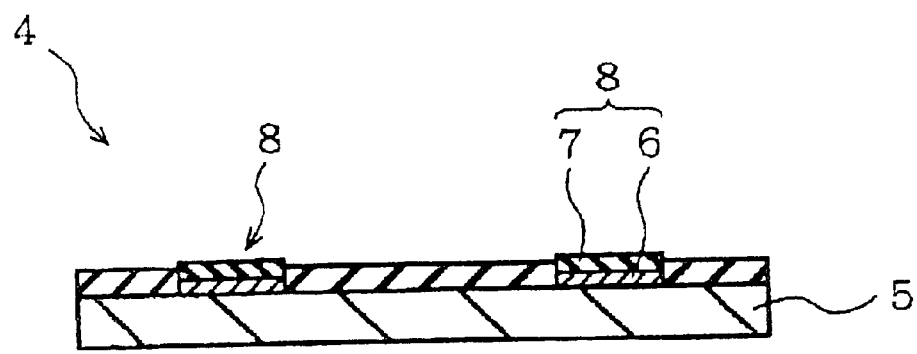
FIG. 7B is a sectional view showing a transcribing original substrate of the wiring pattern formed on the conventional multiple-layer print wiring substrate.

FIGS. 6A to 6D are explanation views showing the structures of the various original substrates used in the wiring pattern formation method, according to the present invention. FIGS. 6A, 6B show the case when the conductive layer 22 is formed on the base substrate 20. FIGS. 6C, 6D show the case when the insulation layer whose surface is made rough is formed on the base substrate. By the way, in FIGS. 6B, 6D, the side of the original substrate has the adhesive layer.

As shown in FIGS. 6A to 6D, when the conductive layer (metallic layer) 22 is formed on the base substrate 20 by using, for example, a sputtering method and the like, and the wiring pattern having the metallic wiring layer 15 is then formed by the electrolytic plating operation and the like (refer to FIGS. 6A, 6B), the removal of the base substrate 20 and the like are done by a mechanically removing method, a method for selectively etching only the conductive layer 22, an etching method for each base substrate 20, a polishing and grinding method or the like.

This removal of the base substrate 20 and the like causes the wiring pattern 12 (25) to be separated from the base substrate 20. Thus, the wiring pattern 12 (25) is left on the wafer 10. By the way, the base substrate 20 can be re-used if only the conductive layer 22 is selectively etched.

Also, after an insulation layer 31 whose surface is made rough at thicknesses from about 10 μm to about 20 μm by using, for example, polyimide, liquid crystal polymer and the like is formed on the wiring pattern side of the base substrate 20, if a non-electrolytic plating operation is performed on the wiring pattern 12 (refer to FIG. 6C), or if both of the metallic wiring layer 15 and the insulation layer 14 in the wiring pattern 12 (25) are formed by the electrolytic plating operation (refer to FIG. 6D), the removal of the base substrate 20 and the like is done by the mechanical removing method. Because both the metallic wiring layer 15 and the insulation 14 are formed by the electroplating operation, conductive layer 22 is required, in addition to the rough insulation layer 31 (refer to FIG. 6D), as an electric power supply layer during the electroplating operation. The wiring pattern can be removed by making the rough (by sand blaster) condition of the insulation layer moderate.

In this way, according to the present invention, the transcribing original substrate in which at least the metallic wiring layer 15 is formed on the base substrate 20 having the linear expansion coefficient substantially equal to that of the wafer 10 is thermally pressed and adhered on the wafer 10 in which the circuit is already formed. Then, the metallic wiring layer 15 is adhered and transcribed onto the wafer 10 through the insulation layer 14 composed of the wiring adhesive placed on any of the transcribing original substrate and the wafer 10. After that, only the base substrate 20 is removed to thereby form the wiring layer on the wafer 10. Then, the pressing and adhering process and the removing process are sequentially repeatedly performed on the plurality of transcribing original substrates. Accordingly, the multiple-layer wiring layer is formed on the wafer 10.

Thus, the base substrate 20 having the linear expansion coefficient substantially equal to that of the wafer 10 is used to thermally press and adhere and transcribe the wiring layer onto the wafer 10. Hence, although the processing temperature of the thermally pressing and adhering operation is high, the dimensional displacement of the wiring layer is never induced in the temperature variation resulting from the difference of the linear expansion coefficient.

As a result, the multiple-layer wiring can be usually formed in the assembling process at the non-multiple-layered wafer level. In the respective transcribed wiring layers, the insulation between the metallic wiring layers 15 is reserved by the insulation layer 14 having the adhesive property laminated on the metallic wiring layer 15.

Even if the area in which the wiring is formed is wide (for example, the wafer having a diameter of about 300 mm or more), it is possible to form the multiple-layer wiring having a high accuracy and a high design free degree. For example, when the linear expansion coefficient of the base substrate is set at a range of about ±2 ppm/degree with respect to the linear expansion coefficient of the wafer, even if the wiring pattern is transcribed onto the wafer having a diameter of about 300 mm at a temperature of 200° C., the dimensional error caused by the difference between the linear expansion coefficients can be reduced to about 50 μm or less at both the ends of the wafer. In addition, the wiring layer configured in the multiple layers can be pulled around the position to be drawn. Thus, this is especially effective for the wafer having a large aperture (for example, a diameter of about 300 mm or more) that is largely affected by the displacement.

Also, only the wiring patterns are sequentially piled up to thereby form the multiple-layer wiring. Thus, for example, if a trouble is induced in the interlayer, it can be recovered unless the trouble portion overlaps under the other wiring layer. Hence, the manufacturing yield can be improved to thereby drop the manufacturing cost. For example, it can be formed at a cost cheaper than that of the case when a via for a connection between layers is opened by a laser.

As mentioned above, according to the present invention, the transcribing original substrate that contains the wiring layer to be transcribed and has the linear expansion coefficient in which the dimensional error from the substrate is within the predetermined range in the heated condition is thermally pressed and adhered on the substrate, and the wiring layer is adhered and transcribed, and the wiring pattern is formed on the substrate through the transcribing operation. Thus, even if the wiring formation using the transcription is carried out in the wide area such as the wafer level, it is possible to obtain the sufficiently dimensional accuracy and further possible to avoid the manufacturing cost to be increased.

Moreover, the original substrate used for the wiring pattern formation method according to the present invention enables the wiring pattern formation method to be attained.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2000-251985 (Filed on Aug. 23$^{rd}$, 2000) including specification, claims, drawings and summary are incorporated herein by reference in its entirety.

What is claimed is:

1. A wiring pattern formation method for forming a wiring pattern on a substrate by using a transcribing operation, comprising the steps of:

forming a conductive layer on a transcribing original substrate;

forming a mask on the conductive layer;

forming a wiring layer on said conductive layer in areas other than where the mask is formed;

transcribing by thermally pressing and adhering the transcribing original substrate, the conductive layer, the mask and the wiring layer onto the substrate, wherein a linear expansion coefficient of the substrate and a linear expansion coefficient of the transcribing original substrate are essentially equal.

2. The wiring pattern formation method according to claim 1, further comprising the step of removing the transcribing original substrate, the conductive layer and the mask.

3. The wiring pattern formation method according to claim 2, further comprising the step of forming an insulation. layer on the wiring layer, after said removing step.

4. The wiring pattern formation method according to claim 1, further comprising the step of forming an adhesive insulation layer on the substrate, prior to said transcribing step.

5. The wiring pattern formation method according to claim 1, further comprising the step of forming an adhesive insulation layer on the wiring layer.

6. The wiring pattern formation method according to claim 5, further comprising the step of forming one of a metallic ball and a metallic bump through the insulation layer and connected to the wiring layer.

7. The wiring pattern formation method according to claim 1, wherein the conductive layer is about 1 $\mu$m.

8. A method for manufacturing a semiconductor device, the method comprising the steps of:

thermally pressing and adhering a transcribing original substrate that has a wiring layer to be transcribed and has a linear expansion coefficient in which a dimensional error from a substrate is within a predetermined range in a heated condition onto the substrate, and adhering and transcribing the wiring layer;

wherein the substrate is a wafer in which a circuit is already formed, sequentially repeating the transcribing operation for forming a multiple wiring layer on the wafer;

coating a part except an outer electrode formation portion in the wiring layer with an insulator, and mounting an outer electrode terminal at the outer electrode formation portion; and cutting the wafer into respective pieces, and generating a semiconductor device.

* * * * *